United States Patent [19]
Osato et al.

[11] Patent Number: 5,140,547
[45] Date of Patent: Aug. 18, 1992

[54] MAGNETIC BUBBLE RECORDING ELEMENT

[75] Inventors: Yoichi Osato, Yokohama; Shinichi Tachibana, Tokyo, both of Japan

[73] Assignee: Canon Kabushiki Kaisha, Tokyo, Japan

[21] Appl. No.: 728,846

[22] Filed: Jul. 10, 1991

Related U.S. Application Data

[63] Continuation of Ser. No. 277,546, Nov. 29, 1988, abandoned.

[30] Foreign Application Priority Data

Dec. 1, 1987 [JP] Japan .................. 62-301505
Dec. 2, 1987 [JP] Japan .................. 62-303198

[51] Int. Cl.⁵ .................. G11C 11/14; G11F 9/30
[52] U.S. Cl. .................. 356/39; 365/27
[58] Field of Search .................. 365/27, 28, 37, 39

[56] References Cited

U.S. PATENT DOCUMENTS

| | | | |
|---|---|---|---|
| 3,699,547 | 10/1972 | Owens et al. | 365/37 |
| 3,714,640 | 1/1973 | Bobeck | 365/27 |
| 3,901,770 | 8/1975 | Littwin | 204/15 |
| 3,968,481 | 7/1976 | Grundy et al. | 340/174 TF |
| 4,110,838 | 8/1978 | Noe | 365/2 |
| 4,125,876 | 11/1978 | Dimyan | 365/3 |
| 4,283,775 | 8/1981 | Cohen | 365/37 |
| 4,369,209 | 1/1983 | Iwashimizu et al. | 427/123 |
| 4,451,500 | 5/1984 | Gerard et al. | 427/38 |
| 4,624,858 | 11/1986 | Capra et al. | 427/38 |

FOREIGN PATENT DOCUMENTS

| | | |
|---|---|---|
| 0076184 | 4/1983 | European Pat. Off. |
| 2807836 | 9/1978 | Fed. Rep. of Germany |
| 2030802 | 4/1980 | United Kingdom |
| 2111775 | 7/1983 | United Kingdom |

OTHER PUBLICATIONS

"Magnetic Ink Bubble Assess Technique", IBM Tech. Disc. Bul. vol. 18 No. 8, DeLuca et al., Jan. 1976, pp. 2673-2674.

"Temperature Stable Self-Biasing Bubbles In Double Layer Films", IEEE Trans. on Mag., Vol. Mag-11, No. 5, Uchishiba et al., Sep. 1975, pp. 1079-1081.

IBM Technical Disclosure Bulletin—vol. 18, No. 9 Feb. 1976 pp. 3082-3084 copy in 365.41.

*Primary Examiner*—Joseph A. Popek
*Attorney, Agent, or Firm*—Fitzpatrick, Cella, Harper & Scinto

[57] ABSTRACT

A magnetic bubble recording element including a substrate having a transfer channel, a first magnetic layer for carrying a magnetic bubble and being formed on the substrate within and outside of the transfer channel with a surface of the first magnetic layer within the transfer channel being offset from at least a portion of a surface of the first magnetic layer outside of the transfer channel, and a second magnetic layer for applying a bias magnetic field to the first magnetic layer being formed on the first magnetic layer within and outside of the transfer channel. The magnetic bubble contained in the first magnetic layer being transferred along the transfer channel by an external magnetic field.

32 Claims, 3 Drawing Sheets

MAGNETIC BUBBLE RECORDING ELEMENT

This application is a continuation of application Ser. No. 07/277,546 filed Nov. 29, 1988, now abandoned.

BACKGROUND OF THE INVENTION

1. Field of the Invention

This invention relates to a magnetic bubble recording element, and more particularly relates to a magnetic bubble recording element in which magnetic bubbles are optically written and read.

2. Description of the Prior Art

Magnetic bubble recording elements have been developed in parallel with semiconductor recording elements. They have the features of being non-volatile memories and being stable in their operation even at high temperatures, and hence their applications for memories are being developed.

An exemplified form of a conventional magnetic bubble recording element is shown in FIGS. 1A and 1B. FIG. 1A is a cross-sectional view thereof, and FIG. 1B is a plan view thereof.

In FIGS. 1A and 1B, there are shown a garnet substrate 1 in which magnetic bubbles are formed, a soft magnetic layer 2 consisting of permalloy or the like for transferring magnetic bubbles, a spacer layer 3 for insulation and a conductive film (interconnection patterns or the like) 4 for generating magnetic field for transferring bubbles or for transmitting several kinds of signals when information is recorded and reproduced.

In order to transfer magnetic bubbles in conventional recording elements, the soft magnetic layer 2 is, for example, magnetized by a rotating magnetic field in a facial direction (i.e., a direction parallel to the upper surface of the substrate 1) which is generated by a coil provided outside the magnetic bubble recording element, or by supplying current in the conductive film 4 shown in FIG. 1B, or the like. On this occasion, in FIG. 1A, magnetic bubbles held in the garnet substrate 1 are drawn and transferred by a bubble capturing point (a generating point of magnetization) which generates around the circumference of the pattern of the soft magnetic layer 2 and moves.

Magnetic bubbles are formed, for example, by applying to the garnet substrate 1 a local vertical magnetic field which is generated by providing a current to the conductive film 4 near a specific point in the pattern of the soft magnetic layer 2. Magnetic bubbles are detected by detectors (magnetic sensors), such as Hall elements, which are disposed in intermediate locations in the pattern of the soft magnetic layer 2.

In such a conventional magnetic bubble element, however, it is necessary to perform fine processing for providing interconnection patterns of signal lines for writing or reading on a wafer, and for the mounting of a magnet, a coil or the like for generating the biasing magnetic field, and it is difficult to provide a low-cost, small and light-weight recording element.

In order to solve such problems, the assignee of the present invention has proposed, in U.S. Pat. application Ser. No. 434,538 filed on Nov. 8, 1989, which is a continuation of application Ser. No. 125,824 filed on Nov. 23, 1987, now abandoned, which is a continuation of application Ser. No. 801,401 now abandoned, and application Ser. No. 593,252 filed on Oct. 1, 1990, which is a continuation of application Ser. No. 257,130 filed on Oct. 7, 1988, now abandoned, which is a continuation of Ser. No. 883,921, now abandoned, a method for optically writing magnetic bubbles and a method for optically reading magnetic bubbles (the contents of both applications are incorporated herein by reference). By using these methods, patterning for writing or reading on a wafer can be made simple.

SUMMARY OF THE INVENTION

It is an object of the present invention to provide an improved magnetic bubble recording element which is suitable for writing and reading magnetic bubbles by using the method for optically writing and reading magnetic bubbles described above.

It is another object of the present invention to provide a magnetic bubble recording element which is low in price and at the same time small in size and light in weight, and to provide a magnetic bubble recording element which is applicable as a portable optical card.

In order to achieve the above-described objects, the present invention is based on providing on a substrate a magnetic layer for containing and carrying bubbles. A magnetic pattern is formed in the substrate to define channels for transferring magnetic bubbles.

A magnetic bubble recording element according to a first aspect of the present invention includes a first magnetic layer for containing and carrying magnetic bubbles and a second magnetic layer for providing a biasing magnetic field to the first magnetic layer to hold the magnetic bubbles in the first magnetic layers are provided in a substrate on which a transfer channel is formed for transferring magnetic bubbles.

A magnetic bubble recording element according to a second aspect of the present invention includes a first magnetic layer for containing and carrying magnetic bubbles and a second magnetic layer for providing a biasing magnetic field to the first magnetic layer to hold the magnetic bubbles in the first magnetic layer are provided on a substrate which has a transfer channel for transferring magnetic bubbles, which channel is defined by a resin film.

Further, a magnetic bubble recording element according to a third aspect of the present invention includes a substrate on which a transfer channel is formed for transferring magnetic bubbles. On an upper portion of the substrate, a soft magnetic layer capable of being magnetized in a facial direction of the substrate, and further a first magnetic layer for containing and carrying magnetic bubbles and a second magnetic layer for providing a biasing magnetic field to the first magnetic layer to hold the magnetic bubbles in the first magnetic layer are provided on said substrate having the soft magnetic layer.

The present inventors have found an interesting method for producing a recording element according to the third aspect from a recording element according to the second aspect. This production method includes a step for transferring a transferring channel consisting of a resin film on a substrate, a step for providing a first magnetic layer for containing and carrying magnetic bubbles and a second magnetic layer for applying a biasing magnetic field to the first magnetic layer to hold the magnetic bubbles in the first magnetic layer in the substrate on which the transfer channel has been formed, and a step for converting a portion of the first magnetic layer close to the resin film into a soft magnetic layer by means of heat treatment of the element at a temperature between the temperature of the substrate when the channel is formed and the softening temperature of the substrate.

While further features and concrete aspects of the present invention will be hereinafter described in connection with these preferred embodiments, it will be apparent to those skilled in the art how to construct magnetic bubble recording elements having several other aspects based on the spirit and scope of the present invention as described above.

DESCRIPTION OF THE PREFERRED EMBODIMENTS

Figure 1A:
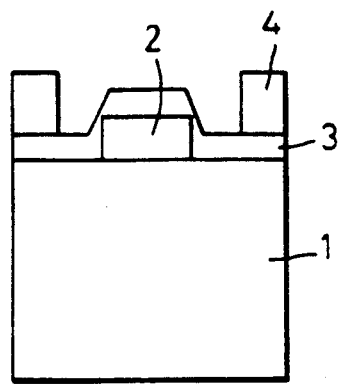
FIGS. 1A and 1B are explanatory diagrams showing a conventional magnetic bubble recording element.
Figure 1B:
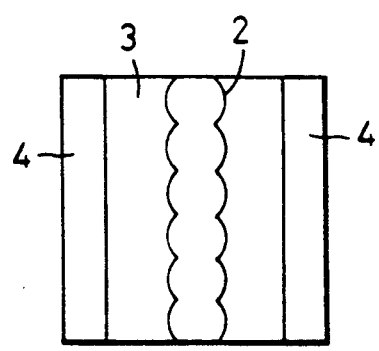
Figure 2A:
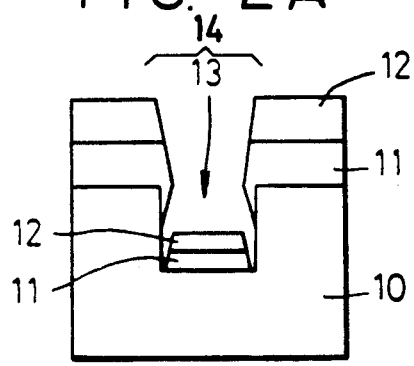
FIGS. 2A and 2B are explanatory diagrams showing an embodiment of a magnetic bubble recording element of the present invention, FIG. 2A being a cross-sectional view, and FIG. 2B a plan view.
Figure 2B:
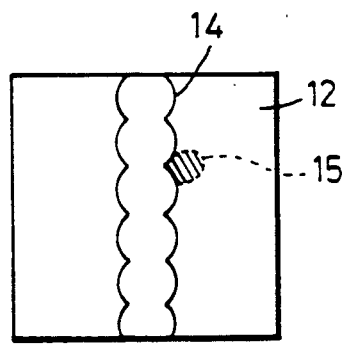

FIGS. 2A and 2B show a first preferred embodiment of the present invention, FIG. 2A is a cross-sectional view for explaining the configuration of the present magnetic bubble recording element, and FIG. 2B is a plan view thereof.

Figure 6:
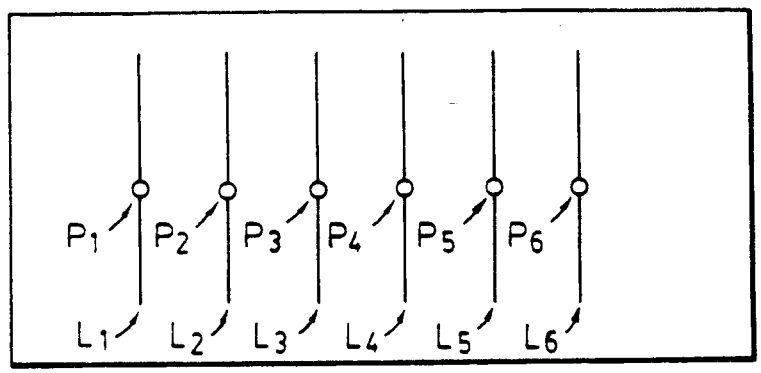
FIG. 6 is a plan view showing an example of a transfer channel pattern formed on a substrate.

In FIG. 2A, a substrate 10 has a recess 13 which defines a transfer channel 14 for magnetic bubbles. As a material for the substrate 10, various inorganic materials, such as metals, semiconductors or dielectrics, or plastics or the like are used. As a method for forming the recess 13 which defines the transfer channel 14 in the substrate 10, there can be used one method in which a resist is coated on a planar substrate and is subsequently etched, as is done in semiconductor device manufacturing processes, or one in which a pattern is transferred to a plastic plate by using a metal plate (a stamper) on which a pattern has been formed by mechanical processing or the above-described etching method as performed in optical-disk substrate manufacturing process, or the like. It will be noted that, in this description, the term "transfer channel pattern" indicates the shape of a set of one or more transfer channels which are formed on a planar substrate of an element in accordance with the function of the element. FIG. 6 is a diagram showing an example of such a transfer channel pattern.

In FIG. 6, each of $L_1$-$L_6$ indicates a transfer channel, respectively. Each of $P_1$-$P_6$ indicates a region which is located within each transfer channel, and in which writing, reading and erasing of magnetic bubbles are performed.

In FIG. 2A, there is shown a magnetic film 11 for containing and carrying magnetic bubbles. As a material thereof, a vertically magnetizable film, such as a crystalline film of ferrite or garnet, or an alloy film consisting of rare-earth elements and transition elements, or the like is used. As a film forming method, sputtering, vacuum deposition, CVD or the like is used.

A magnetic film (a second magnetic layer) 12 is for providing a biasing magnetic field which is perpendicular to the surface of the film 11 to hold magnetic bubbles in magnetic film 11 (the first magnetic layer). The material and film forming method for the magnetic film 12 can be selected in the same way as for the magnetic film 11. In order to obtain a stable biasing magnetic field even while magnetic bubbles are transferred along the transfer channels, materials and compositions of both magnetic films 11 and 12 are selected such that an applied magnetic field for causing reversal of magnetization to the magnetic film 12 is larger than an applied magnetic field for causing saturation of magnetization in the vertical direction to the film surface to the magnetic film 11.

In FIG. 2B, there are shown a transfer channel 14 for transferring magnetic bubbles and a magnetic bubble 15 within a magnetic film 11, as seen from above an element.

Transfer of magnetic bubbles is performed by the same method as that of the conventional technique. That is, by movement of a capturing point of magnetic bubbles (a generating point of facial magnetization) which is generated in a circumferential portion (i.e., a portion in which the magnetic film becomes discontinuous caused by irregularity of the substrate 10) of the transfer channel 14 by a rotating magnetic field in a facial direction (in a direction parallel to the film surfaces of the films 11 and 12) of the substrate which is generated by a coil disposed outside the substrate 10, a magnetic bubble within a magnetic film 11 is moved along the circumferential portion of the transfer channel 14 in a direction perpendicular to the paper surface in FIG. 2B.

Figure 3:
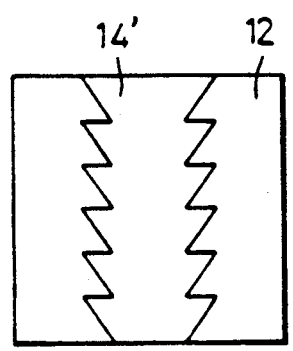
FIG. 3 is a plan view showing a modified example of the transfer channel pattern shown in FIG. 2B.

FIG. 3 is a diagram showing a transfer channel 14' which has an asymmetrical or irregular shape (shown as serrated) in the plane of the paper, and which is a modified example of the transfer channel pattern 14 in FIG. 2B. The diameter of a bubble expands and contracts by a vibrational magnetic field in the direction vertical to the substrate surface which is generated by a coil disposed outside the substrate 10. The bubble is moved along a capturing point of bubbles which is generated near the transfer channel 14' in the direction parallel to the paper surface in FIG. 3.

Figure 4:
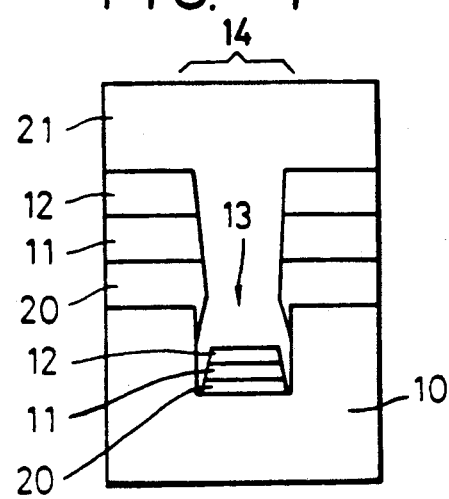
FIG. 4 is a cross-sectional view showing a modified example of the embodiment shown in FIGS. 2A and 2B.

FIG. 4 is a cross-sectional view showing a modified example of the magnetic bubble recording element in FIG. 2A. In FIG. 4, the same components as in FIG. 2A are indicated by the same numerals. A soft magnetic film 20 is for making the magnetization of the capturing point of magnetic bubbles in the transfer channel 14 large, and is easily magnetized in a direction parallel to the film surface. A protective film 21 is provided for improving resistivity to the weather and durability of each of the magnetic films 11, 12 and 20. As a material for the protective film 21, organic materials, such as oxides, nitrides, carbides or the like, metal materials, or polymer materials which are cured by light, heat or the like, are used. It will be noted that, in the present invention, the positions of the magnetic film 12 for providing the biasing magnetic field and the soft magnetic film 20 may be exchanged with each other.

The protective film 21 may also be provided between each adjacent pair of the other magnetic films.

Next, an example of formation of a magnetic bubble recording element of the present invention will be shown. In the present example of formation, the element shown in FIGS. 2A and 2B was formed.

First, a transfer channel defined by a recess was formed on an acrylic-resin plate 1 mm thick by using a stamper provided with a convex pattern and a nonmagnetic and photo-polymerizable acrylic-system resin. The transfer channel 14 had a contiguous-disk pattern with a shape of somewhat like the silhouette of a string of beads of a diameter of about 5 $\mu$m, as shown in FIG. 2B, and the thickness thereof was about 1 $\mu$m.

A $Gd_{23}Co_{77}$ (atomic ratio) film 7000 Å thick was then provided by sputtering method as a magnetic film for containing and carrying magnetic bubbles. Saturation magnetization Ms of the magnetic film was 250 emu/cc, and the characteristic length thereof was 0.4 $\mu$m.

Subsequently, a $Tb_{20}Fe_{70}Co_{10}$ (atomic ratio) film 3000 Å thick was provided by the sputtering method as a magnetic film for generating the biasing magnetic field. The magnitude of an applied magnetic field which is necessary for reversal of the magnetization of the magnetic film was no less than 20 kOe. An acrylic-system photo-polymerizable resin 20 $\mu$m thick was then provided as the protective film explained in connection with FIG. 4.

Figure 5:
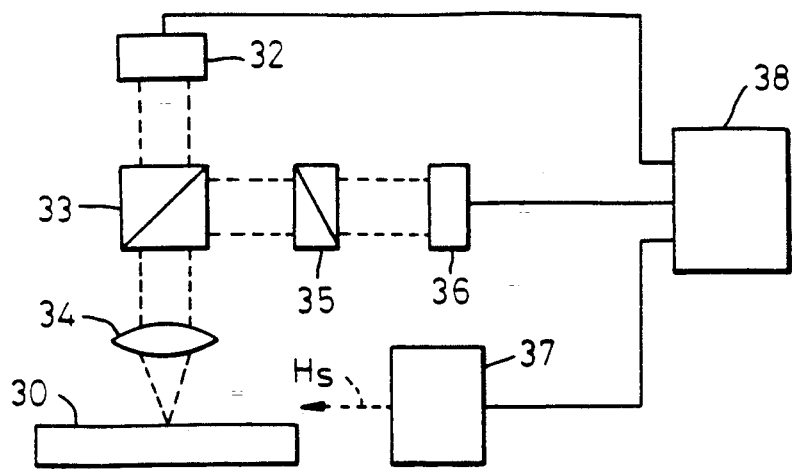
FIG. 5 is a schematic configurational diagram showing an example of an optical information recording and reproducing apparatus which performs writing and reading of magnetic bubbles for a magnetic bubble recording element of the present invention.

FIG. 5 is a schematic configurational diagram showing an example of an optical information recording and reproducing apparatus for writing magnetic bubbles in the present magnetic bubble recording element or reading (or reading absence of a magnetic bubble) magnetic bubbles from the element. The apparatus is configured by components indicated by numerals 32–38.

In FIG. 5, there are shown a light source 32 provided with a semiconductor laser, a beam splitter 33, an objective lens 34 for focusing light, a magnetic bubble recording element 30 of the present invention, an analyzer 35, a photosensor 36, a facial rotating magnetic field generating device 37 and a control unit 38. The light source 32, the photosensor 36 and the device 37 are connected to the control unit 38 by signal lines. The control unit 38 sends signals to the light source 32 via a signal line to perform intensity modulation of a laser beam emitted from the light source 32. The control unit 38 also sends signals to the device 37 provided with a coil and a driver for supplying current to the coil via a signal line to control the direction and intensity of the facial magnetic field Hs for the magnetic bubble recording element. Signals from the photosensor 36 are sent to the control unit 38 via a signal line and are processed therein. A beam emitted from the semiconductor laser is made into a parallel light beam by a collimating lens (not shown), and subsequently passes through the beam splitter 33 and the objective lens 34, and is focused on the magnetic bubble recording element 30 of the present invention. The laser beam reflected by the magnetic bubble recording element 30 passes through the objective lens 34, the beam splitter 33 and the analyzer 35 and reaches the photosensor 36.

At the moment of formation of a magnetic bubble, the temperature at a focusing point in the magnetic bubble recording element 30 is raised by making an output of the semiconductor laser larger than that at the moment of detecting a magnetic bubble to be described later to reverse the magnetization of the film 11 for forming magnetic bubbles. A vertical magnetic field for assisting reversal of magnetization may also be applied when necessary. Similarly, a magnetic bubble can also be erased by irradiating a laser beam on the magnetic bubble to cause reversal of magnetization.

For detection of a magnetic bubble, the magneto-optical effect is used. That is, a laser beam reflected by a magnetic bubble-detecting area as shown by $P_1$–$P_6$ in FIG. 6 differs as to the direction to which the plane of polarization is rotated according to the direction of the magnetization (relative to the vertical direction of the film surface) of the detecting area. Hence, by properly adjusting a setting angle of the analyzer 35, the amount of the laser beam incident on the photosensor 36 can be made to change in accordance with the presence or absence of a magnetic bubble in the detecting area.

In information recording by means of the apparatus shown in FIG. 5, signals corresponding to recorded information may be input from the control unit 38 into the light source 32, modulating the intensity of the laser beam by the signals, and a facial rotating magnetic field Hs may be applied to the magnetic bubble recording element 30 by the device 37 in synchronization with the action described above to transfer magnetic bubbles successively written in the magnetic film along the transfer channel. On the contrary, when performing information reproducing, the facial rotating magnetic field Hs may be applied to the magnetic bubble recording element 30 by the device 37 to successively sending magnetic bubbles to the magnetic bubbledetecting area, and signals which are output from the photosensor 36 in synchronization with the action described above may be processed by the control unit 38 to convert them into a suitable data (information) carrying format.

The configuration of the magnetic bubble recording element 30 described above is, for example, the one explained in FIGS. 2–4. As for the magnetic film 11 for containing and carrying magnetic bubbles and the magnetic film 12 for generating the biasing magnetic field, materials were selected so that the magnetization of the magnetic film 12 is not reversed even when reversal of the magnetization (the direction of the magnetization becomes reversed to the direction of the biasing magnetic field) occurs in the magnetic film 11 by irradiation of the laser beam.

As explained above in detail, according to the present magnetic bubble recording element, a permanent magnet or a coil for applying the biasing magnetic field becomes unnecessary due to the provision of a first magnetic film for containing and carrying magnetic bubbles and a magnetic film for providing the biasing magnetic field in order to stably hold magnetic bubbles in the first magnetic film on a substrate having a transfer channel for transferring magnetic bubbles, and it is possible to provide a recording element which is simple in configuration, easy to carry and inexpensive.

It also becomes possible to provide a novel magnetic bubble recording and reproducing system, comprising a combination of the present magnetic bubble recording element and an optical information recording and reproducing apparatus which is capable of writing, reading and transferring data on a surface of the above-described element without contacting the element.

Further, on the assumption of such a system, it is possible to create a novel optical card in which magnetic bubbles are used as a recording medium, by making the substrate of the element a card-like shape. Thus, it is possible to provide a portable memory which is extremely reliable.

Figure 7A:
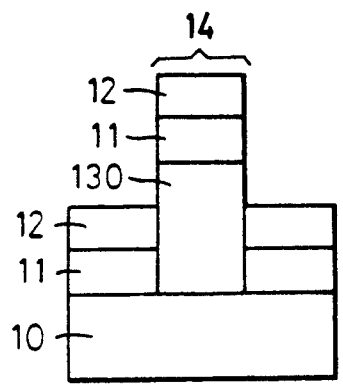
FIGS. 7A through 7C are explanatory diagrams showing another embodiment of a magnetic bubble recording element of the present invention, FIGS. 7A and 7C being cross-sectional views and FIG. 7B a plan view.
Figure 7B:
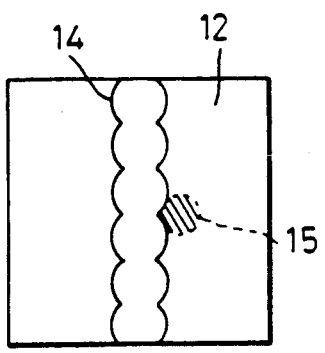
Figure 7C:
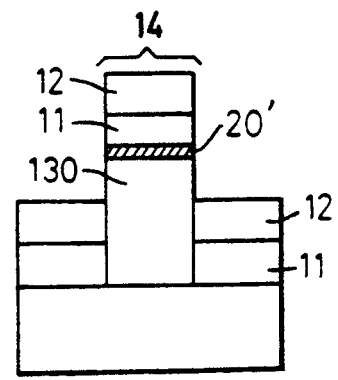

FIGS. 7A through 7C show another embodiment of the present invention, FIGS. 7A and 7C are cross-sectional views for explaining a configuration of a magnetic bubble recording element of the present embodiment, respectively, and FIG. 7B is a plan view thereof.

In FIGS. 7A-7C, the same components as components shown in FIGS. 2A, 2B, FIG. 3 and FIG. 4 are indicated by the same numerals, and here, detailed explanation of these components will be omitted. A projection 130 on the substrate 10 defines a transfer channel transferring magnetic bubbles and consists of a resin film. This is termed hereafter "a resin film 130". The proper selection of thickness and of materials for the resin film 130 will be described hereafter.

In the present embodiment, also, in order to obtain a biasing magnetic field for stabilizing magnetic bubbles even during transfer thereof, materials and compositions of both magnetic films are selected so that an applied magnetic field for causing reversal of the magnetization of the film 12 for generating the biasing magnetic field is larger than an applied magnetic field for saturating the magnetization perpendicular to the surface of the magnetic film 11 for forming magnetic bubbles.

Further, as described in connection with the foregoing embodiment, a transfer channel 14 having the asymmetrical shape shown in FIG. 3 may be used instead of the transfer channel 14 having a contiguous disk pattern shown in FIG. 7B.

FIG. 7C is a diagram showing a configuration of the magnetic bubble recording element of FIG. 7A after heat treatment, in a production method of a magnetic bubble recording element to be described later. A soft magnetic layer 20′ is formed in a region of the magnetic film 11 adjacent to the resin film 130.

Figure 8:
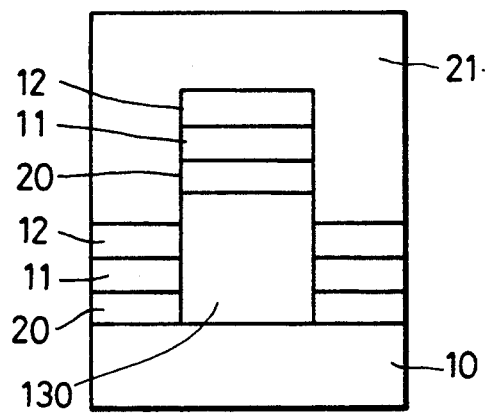
FIG. 8 is a cross-sectional view of a modified example of the embodiment shown in FIGS. 7B and 7C.

FIG. 8 is a modified example of the magnetic bubble recording element of FIG. 7A. The same components as in FIG. 7A are indicated by the same numerals in FIG. 8. A soft magnetic film 20 for increasing the magnetization (i.e., the magnetization of the facial component) of the bubble-capturing point in the transfer channel pattern is formed by sputtering, vacuum deposition, CVD or the like. A protective film 21 is for improving resistance to the weather and durability of each of the magnetic films. As a material therefor, inorganic materials, such as oxides, nitrides, carbides or the like, or metal materials, or polymer materials which are cured by light, heat or the like are used, as described above. It will be noted that in this configuration, the positions of the magnetic film 12 for providing the biasing magnetic field and the soft magnetic film 20 are exchanged with each other. A protective film may also be provided between each adjacent pair of the magnetic films.

One method for increasing the facial magnetization of the magnetic bubble capturing point in the magnetic bubble recording element of the present invention is forming the soft magnetic layer 20 on the substrate 10 by sputtering, vacuum deposition, CVD or the like as shown in FIGS. 4 and 7. Another method is as shown in FIG. 7C, which the present inventors have conceived.

This other method has the feature that a soft magnetic film is produced which has an easy magnetization axis within the substrate surface near the transfer channel pattern, by heating the resin film 130. That is, the method produces strong bubble capturing points in circumferential portions of the pattern by releasing constituents of the resin by heating and thereby converting a region of the magnetic film adjacent to the resin film 130 into a soft magnetic film.

The resin film 130 transferred to the substrate 10 has properties such that it becomes a very soft film by proper selection of the material and by heating at a temperature no higher than the softening temperature of the substrate 10, or it releases alcohol or organic substances having low molecular weights. The above-described method utilizes these properties. That is, a part of the magnetic film 11 deposited on the resin film 130 is modified, and is converted into a soft magnetic film having an easy magnetization axis within the substrate surface. A heating temperature for this processing should be between the temperature of the substrate 10 during the process of forming the transfer channel (the resin film 130) for the magnetic bubbles in the substrate 10, and the softening temperature of the substrate 10. The details will be described later in connection with another example of forming the present magnetic bubble recording element.

There is also another reason for producing the generation points of magnetization in a direction of the substrate surface at circumferential portions of the transfer channel in the magnetic bubble recording element of the present embodiment, as explained below.

Figure 9:
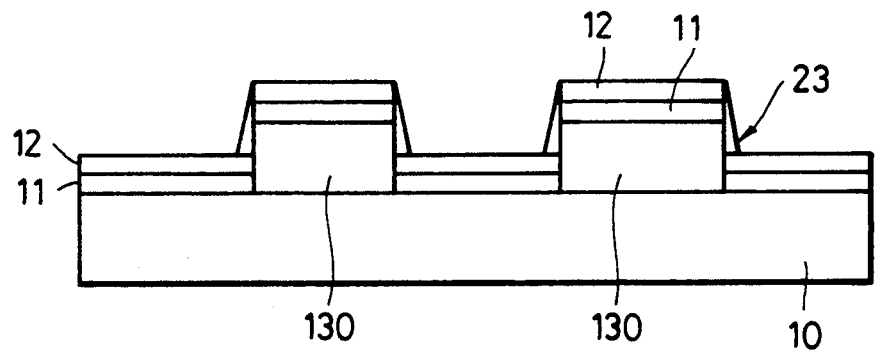
FIG. 9 is a cross-sectional view of a modified example of the embodiment shown in FIGS. 7A and 7B.

FIG. 9 is a partially enlarged cross-sectional view of the present magnetic bubble recording element for explaining the reason. There are shown a substrate 10, a transferred resin film 130, a magnetic film 11 for containing and carrying magnetic bubbles and a magnetic film 12 for generating a biasing magnetic field. Since compositions of the magnetic film 11 and the magnetic film 12 are selected so that the easy magnetization axes become perpendicular to the substrate surface (the film surface), these magnetic films are substantially not easily magnetizable in the direction of the substrate surface. However, a magnetic film deposited on a circumferential portion of the transferred resin film 11 shown by the arrow 23 has an oblique angle of incidence of material elements for the magnetic film onto the substrate surface when the element is formed, while the magnetic films 11 and 12 have a nearly vertical angle of incidence onto the substrate surface.

As a result, the magnetic film at the position 23 has both components which are easily magnetized to the vertical direction and to the horizontal direction to the film surface, respectively. Hence, when a rotating magnetic field in the direction of the substrate surface is applied in order to transfer magnetic bubbles, the component vertical to the film surface of the magnetic film at the position 23 is easily magnetized, and magnetic bubble-capturing points are generated. These points assist the transferring action of the present magnetic bubble recording element.

Next, another example of forming the present magnetic bubble recording element will be described.

First, a transfer channel consisting of a convex resin film was formed on a non-magnetic glass substrate 1 mm thick using a stamper provided with a recess and an epoxyacrylate-system photo-polymerizable resin.

The transfer channel is a contiguous-disk pattern having a shape similar to a silhouette of a chain of beads of a diameter of about 10 $\mu$m, as shown in FIG. 7B, and the thickness thereof was about 3 $\mu$m.

Next, a $Gd_{20}Co_{70}Mo_{10}$ (atomic ratio) film 3000 Å thick was provided by the sputtering method as a magnetic film for containing and carrying magnetic bubbles. The saturation magnetization $4\pi Ms$ of the magnetic film was 300 G, coercive force was 150 G and the applied magnetic field for saturating the magnetization was 1200 G.

Then, a $Tb_{18}FE_{62}Co_{30}$ (atomic ratio) film 3000 Å thick was provided by the sputtering method as a magnetic film for generating a biasing magnetic field. An applied magnetic field necessary for reversal of the magnetization of the magnetic film was no less than 10 KG.

A polyimide resin 25 μm thick was then provided as a protective film.

The magnetization of the magnetic film of the recording element samples formed by the above-described method was then aligned to the direction perpendicular to the substrate surface (the film surface) by an applied magnetic field of no less than 10 kG, and subsequently magnetic bubbles were formed in the magnetic film by the apparatus shown in FIG. 5. The movement of magnetic bubbles was then observed by a polarization microscope upon application of a 120 G rotating magnetic field in the direction of the substrate surface which has a frequency of 10 Hz. As a result, the movement of magnetic bubbles having a diameter of about 4 μm along the transfer channel could be observed.

Next, various samples were produced with the same conditions as in the above-described production example except that the kinds of resins for forming the transfer channels were modified, and the movement of magnetic bubbles of each sample was observed.

Further, the above-described samples were heat-treated at 200° C., which is between the substrate temperature (about 25° C.) during the formation of the transfer channel and the softening temperature (no lower than 600° C.) of the glass substrate, for 30 minutes, and subsequently the movement of magnetic bubbles was observed again. The results of the observations are shown in TABLE 1.

TABLE 1

| Sample No. | Kind/name of resin | Materials released upon heat treatment | Transfer of magnetic bubbles | Transfer of magnetic bubbles after heating |
|---|---|---|---|---|
| 1-1 | epoxyacrylate resin MP-107 Mitsubishi Rayon Corp. | alcohol, ketone, monomer, polymerization initiator | Δ | ⊙ |
| 1-2 | urethaneacrylate resin INC 118 Nippon Powder Corp. | alcohol, ketone monomer, polymerization initiator | Δ | ⊙ |
| 1-3 | polyesteracrylate resin EX-401 Dainippon Ink Chemical Corp. | alcohol, ketone monomer, polymerization initiator | Δ | ⊙ |
| 1-4 | thiol salt-system resin the following resin composite* used | none | Δ | Δ |
| 1-5 | photo-cation polymerization-system resin KR-400 Asahi Denka Corp. | Lewis acid | Δ | |
| 1-6 | epoxy resin Epichrone5600 Dainippon Ink Chemical Corp. | hardener, monomer | Δ | |
| 1-7 | epoxyurethane resin Epithane E-340 Dainippon Ink Chemical Corp. | hardener, monomer | Δ | |

*Note: diarylmaleinate and ethyleneglycoldimercaptopropionate were mixed at an equivalent ratio of 1:1, and 1 weight % benzophenone, 0.1 weight % of 2, 6-dibutyl-4-methylphenone, and 0.1 weight % of aqueous solution of $H_3PO_3$ were added thereto.

In TABLE 1, in the column headed "Materials released upon heat treatment", the main substances which are included in resins being formed are shown.

In the column headed "Transfer of magnetic bubbles", Δ indicates those samples for which transfer occurred following application of a 10 Hz rotating magnetic field, while ⊙ indicates those for which good transfer occurred even with a rotating field no less than 500 Hz, and ○ indicates those which have an intermediate evaluation between the two described above.

The improvement in transfer action by heat treatment is considered to be an effect due to the increase of the magnetization component in the direction of the substrate surface in the transferring channel in the foregoing explanation. The magnetization components in the substrate surface of the samples 1-1 through 1-7 in TABLE 1 were measured before and after heat treatment by a vibrating-sample magnetometer (VSM), and it was confirmed that the facial magnetization components increased about 15-20% in average, and about 30% in the case of Sample 1-7.

As for the problem relative to the thickness of the resin film described above, a check was performed as to whether magnetic bubbles are transferred better as a result of changing the thickness of the transfer channel made using resin, and the result was that magnetic bubbles were not favorably transferred when the thickness is no more than 5000 Å. According to this result, it can be considered that in the present magnetic bubble recording element, a thicker transfer channel (i.e., that a magnetic film is discontinuous) is a more important factor contributing to favorable transfer of magnetic bubbles, than is the total thickness of the magnetic films.

As described above, the present invention has the following effects.

1. A predetermined transfer channel is formed on a substrate by various methods, and a magnetic layer for containing and carrying magnetic bubbles is formed on the substrate to define a pattern of transfer channels for transferring magnetic bubbles. Consequently, patterning is necessary only once in production, and thus a recording element with low cost can be provided.

2. By using a laser beam as in magnetic-optical disks, it is possible to form magnetic bubbles (record information), detect the presence of magnetic bubbles (reproduce information) and erase magnetic bubbles (erase information) without contacting the magnetic bubble recording element. Hence, no fine processing for providing interconnection patterns of several signal lines for recording, reproducing and erasing in the recording element itself is necessary, and the structure is simple.

3. By providing a magnet or the like for generating a magnetic field for driving magnetic bubbles at the recording and reproducing apparatus side, it is possible to provide a magnetic bubble recording element which is small in size, light in weight and portable, and it is also possible to utilize the element as an optical card.

4. It becomes simple to form a soft magnetic layer which is easily magnetizable in a direction of the substrate surface in a region of a magnetic film adjacent to a resin film of a transfer channel by heat treatment, and thus the transfer performance of magnetic bubbles can be improved.

That is, the present invention has solved disadvantages of the magnetic bubble recording element including complicated design, large size, and heaviness due to the fact that configurations corresponding to recording, erasing and reproducing of information are incorporated within one element, by means of combining a recording medium having a configuration in which only retention and transfer of magnetic bubbles are considered with an optical method which performs recording, reproducing and erasing for the recording medium.

We claim:

1. A magnetic bubble recording element comprising:
   a substrate having a transfer channel;
   a first magnetic layer for carrying a magnetic bubble, said first magnetic layer being formed on said substrate within and outside of said transfer channel with a surface of said first magnetic layer within said transfer channel being offset from at least a portion of a surface of said first magnetic layer outside of said transfer channel; and
   a second magnetic layer for applying a bias magnetic field to said first magnetic layer, said second magnetic layer being formed on said first magnetic layer within and outside of said transfer channel.

2. A magnetic bubble recording element according to claim 1, wherein said substrate is made of a nonmagnetic substance.

3. A magnetic bubble recording element according to claim 2, wherein said substrate consists of a glass or a plastic.

4. A magnetic bubble recording element according to claim 2, wherein said transfer channel is defined by a recess formed in said substrate.

5. A magnetic bubble recording element according to claim 2, wherein said transfer channel is defined by a projection of a resin film on said substrate.

6. A magnetic bubble recording element according to claim 1, wherein said transfer channel has a thickness larger than that of said first magnetic layer.

7. A magnetic bubble recording element according to claim 1, further including a soft magnetic layer between said substrate and said first magnetic layer, and said soft magnetic layer being magnetized in a facial direction of said substrate when said magnetic bubbles are transferred by a facial rotating magnetic field.

8. A magnetic bubble recording element according to claim 1, further including a protective film for protecting said first and second magnetic layers.

9. A magnetic bubble recording element according to claim 1, wherein said first and second magnetic layers are such that an applied magnetic field needed for reversal of the magnetization of said second magnetic layer is larger than an applied magnetic field when the magnetization in the direction perpendicular to the film surface of said first magnetic layer is saturated.

10. A magnetic bubble recording element according to claim 1, further comprising a protective film for protecting said first and second magnetic layers.

11. A method for producing a magnetic bubble recording element comprising the steps of:
    forming a transfer channel made of a resin film on a substrate;
    providing a first magnetic layer on the substrate for containing and carrying magnetic bubbles and a second magnetic layer on the first magnetic layer for applying a biasing magnetic field to the first magnetic layer, after said step of forming the transfer channel; and
    converting a region of the first magnetic layer adjacent to the resin film into a soft magnetic layer by performing a heat treatment of the region.

12. A method for producing a magnetic bubble recording element according to claim 11, wherein a temperature during the heat treatment in said converting step is between a temperature of the substrate in said step of forming and a softening temperature of the substrate.

13. A method for producing a magnetic bubble recording element according to claim 12, wherein the substrate is made of a glass or a plastic.

14. A magnetic bubble recording element comprising:
    a plastic plate having a transfer channel, said transfer channel being formed on the plastic plate; and
    a magnetic layer capable of containing a magnetic bubble, said magnetic layer being formed on said plastic plate within and outside of said transfer channel, and a surface of the magnetic layer within the transfer channel being offset from at least a portion of a surface of the magnetic layer outside of the transfer channel.

15. A magnetic bubble recording element according to claim 14, further comprising a magnetic film for applying a bias magnetic field to said magnetic layer, said magnetic film being formed on said magnetic layer within and outside of said transfer channel.

16. A magnetic bubble recording element according to claim 15, further comprising a protective film for protecting said magnetic film and said magnetic layer.

17. A magnetic bubble recording element according to claim 14, further comprising a magnetic film for applying a bias magnetic field to said magnetic layer, said magnetic film being formed between said plastic plate and said magnetic layer within and outside of said transfer channel.

18. A magnetic bubble recording element according to claim 17, further comprising a protective film for protecting said magnetic film and said magnetic layer.

19. A magnetic bubble recording element comprising:
    a substrate having a transfer channel;
    a first magnetic layer for carrying a magnetic bubble formed on said substrate within and outside of said transfer channel with a surface of said first magnetic layer within said transfer channel being offset from at least a portion of a surface of said first magnetic layer outside of said transfer channel; and
    a second magnetic layer for applying a bias magnetic field to said first magnetic layer formed between said substrate and said first magnetic layer within and outside of said transfer channel.

20. A magnetic bubble recording element according to claim 19, further comprising a soft magnetic layer on said first magnetic layer magnetized in a facial direction of said substrate when said magnetic bubble is transferred by a facial rotating magnetic field.

21. A magnetic bubble recording element according to claim 19, wherein said substrate comprises a glass or a plastic.

22. A magnetic bubble recording element according to claim 21, wherein said transfer channel is defined by a recess formed in said substrate.

23. A magnetic bubble recording element according to claim 21, wherein said transfer channel is defined by a projection of a resin film on said substrate.

24. A magnetic bubble recording element according to claim 19, wherein said substrate comprises a nonmagnetic substance.

25. A magnetic bubble recording element according to claim 19, wherein said transfer channel has a thickness larger than that of said first and second magnetic layers.

26. A magnetic bubble recording element according to claim 19, further comprising a protective film for protecting said first and second magnetic layers.

27. A method for recording information on a magnetic bubble recording element comprising a plastic plate having a transfer channel and a magnetic layer formed within and outside of said transfer channel on said plate, a surface of said magnetic layer within said transfer channel being offset from the surface of said magnetic layer around and outside of said transfer channel, said method comprising the steps of:
  forming a magnetic bubble on a predetermined position of said magnetic layer by applying a radiation beam to said magnetic layer, and
  moving said magnetic bubble from said position along said transfer channel by applying an inplane magnetic field to said magnetic layer and rotating said inplane magnetic field.

28. A method for reproducing information from a magnetic bubble recording element comprising a plastic plate having a transfer channel and a magnetic layer formed within and outside of said transfer channel on said plate, a surface of said magnetic layer within said transfer channel being offset from the surface of said magnetic layer around and outside of said transfer channel, said method comprising the steps of:
  moving said magnetic bubble along said transfer channel to a predetermined position by applying an inplane magnetic field to said magnetic layer and rotating said inplane magnetic field; and
  forming a reflecting beam by applying a radiation beam to said position of said magnetic layer; and
  detecting said magnetic bubble by receiving said reflecting beam through an analyzer.

29. A method for recording information on a magnetic bubble recording element comprising a substrate having a transfer channel, a first magnetic layer for carrying a magnetic bubble formed within and outside of the transfer channel on the substrate and a second magnetic layer for applying a bias field to the first magnetic layer formed within and outside of said transfer channel on the first magnetic layer, a surface of said first magnetic layer within said transfer channel being offset from a surface of said magnetic layer around and outside of said transfer channel, said method comprising the steps of:
  forming a magnetic bubble on a predetermined position of said magnetic layer by applying a radiation beam to said magnetic layer; and
  moving said magnetic bubble from said position along said transfer channel by applying an inplane magnetic field to said magnetic layer and rotating the inplane magnetic field.

30. A method for reproducing information from a magnetic bubble recording element comprising a substrate having a transfer channel, a first magnetic layer for carrying a magnetic bubble formed within and outside of the transfer channel on the substrate and a second magnetic layer for applying a bias field on the first magnetic layer formed within and outside of said transfer channel on the first magnetic layer, a surface of said first magnetic layer within said transfer channel being offset from a surface of said magnetic layer around and outside of said transfer channel, said method comprising the steps of:
  moving said magnetic bubble to a predetermined position along said transfer channel by applying an inplane magnetic field to said magnetic layer and rotating the inplane magnetic field;
  forming a reflecting beam by applying a radiation beam to said position of said magnetic layer; and
  detecting said magnetic bubble by receiving the reflecting beam through an analyzer.

31. A method for recording information on a magnetic bubble recording element comprising a substrate having a transfer channel, a first magnetic layer for carrying a magnetic bubble formed within and outside of the transfer channel on the substrate and a second magnetic layer for applying a bias field on the first magnetic layer formed within and outside of said transfer channel between the first magnetic layer and said substrate, a surface of said first magnetic layer within said transfer channel being offset from a surface of said magnetic layer around and outside of said transfer channel, said method comprising the steps of:
  forming a magnetic bubble on a predetermined position of said magnetic layer by applying a radiation beam to said magnetic layer; and
  moving said magnetic bubble along said transfer channel from said position by applying an inplane magnetic field on said magnetic layer and rotating the inplane magnetic field.

32. A method for reproducing information from a magnetic bubble recording element comprising a substrate having a transfer channel, a first magnetic layer for carrying a magnetic bubble formed within and outside of the transfer channel on the substrate and a second magnetic layer for applying a bias field on the first magnetic layer formed within and outside of said transfer channel between the first magnetic layer and said substrate, a surface of said first magnetic layer within said transfer channel being offset from a surface of said magnetic layer around and outside of said transfer channel, said method comprising the steps of;
  moving said magnetic bubble to a predetermined position along said transfer channel by applying an inplane magnetic field on said magnetic layer and rotating the inplane magnetic field;
  forming a reflecting beam by applying a radiation beam on said position of said magnetic layer; and
  detecting said magnetic bubble by receiving the reflecting beam through an analyzer.

* * * * *

UNITED STATES PATENT AND TRADEMARK OFFICE
CERTIFICATE OF CORRECTION

PATENT NO. : 5,140,547

DATED : August 18, 1992

INVENTOR(S) : YOICHI OSATO ET AL.          Page 1 of 3

It is certified that error appears in the above-identified patent and that said Letters Patent is hereby corrected as shown below:

COLUMN 2

Line 21, "carrying" should read --carrying magnetic--.
Line 22, "magnetic" should be deleted.
Line 29, "layers" should read --layer--.
Line 58, "transferring" should read --forming--.

COLUMN 6

Line 32, "sending" should read --send--.
Line 33, "bubbledetecting" should read --bubble-detecting--.
Line 55, "in order to stably hold" should read --to hold the--.

COLUMN 7

Line 14, "channel" should read --channel for--.
Line 30, "channel 14" should read --channel 14'--.

COLUMN 9

Line 13, "KG." should read --kG.--.
Table 1, "Transfer" should read --Transfer--.

| of magnetic bubbles after heating | of magnetic bubbles after heating |
|---|---|
| ⊚ | ⊚ |
| ⊚ | ⊚ |
| ⊚ | ⊚ |
| △ | △ |
|   | ○ |

UNITED STATES PATENT AND TRADEMARK OFFICE
CERTIFICATE OF CORRECTION

PATENT NO. : 5,140,547
DATED : August 18, 1992
INVENTOR(S) : YOICHI OSATO ET AL.

It is certified that error appears in the above-identified patent and that said Letters Patent is hereby corrected as shown below:

COLUMN 10

Line 58, "pattern" should read --substrate--.
Table 1-continued, "Transfer" should read --Transfer--.
of                of
magnetic          magnetic
bubbles           bubbles
after             after
heating           heating
                  O
                  O

COLUMN 13

Line 51, "and" should be deleted.

UNITED STATES PATENT AND TRADEMARK OFFICE
CERTIFICATE OF CORRECTION

PATENT NO. : 5,140,547

DATED : August 18, 1992

INVENTOR(S) : YOICHI OSATO ET AL.

It is certified that error appears in the above-identified patent and that said Letters Patent is hereby corrected as shown below:

COLUMN 14

Line 26, "detecting" should read --¶ detecting--.
Line 58, "of;" should read --of:--.
Line 65, "detecting" should read --¶ detecting--.

Signed and Sealed this

Second Day of November, 1993

*Attest:*

BRUCE LEHMAN

*Attesting Officer*     Commissioner of Patents and Trademarks